(12) United States Patent
Ottewill et al.

(10) Patent No.: US 9,459,088 B2
(45) Date of Patent: Oct. 4, 2016

(54) METHOD AND APPARATUS FOR MONITORING THE CONDITION OF ELECTROMECHANICAL SYSTEMS

(75) Inventors: James Ottewill, Middlesex (GB); Michal Orkisz, Cracow (PL)

(73) Assignee: ABB TECHNOLOGY AG, Zurich (CH)

( * ) Notice: Subject to any disclaimer, the term of this patent is extended or adjusted under 35 U.S.C. 154(b) by 478 days.

(21) Appl. No.: 14/115,912

(22) PCT Filed: Mar. 21, 2012

(86) PCT No.: PCT/EP2012/001233
§ 371 (c)(1),
(2), (4) Date: Nov. 6, 2013

(87) PCT Pub. No.: WO2012/152353
PCT Pub. Date: Nov. 15, 2012

(65) Prior Publication Data
US 2014/0074427 A1    Mar. 13, 2014

(30) Foreign Application Priority Data

May 12, 2011    (EP) .................................... 11460026

(51) Int. Cl.
*G06F 11/00*    (2006.01)
*G01B 7/00*    (2006.01)
(Continued)

(52) U.S. Cl.
CPC ............. *G01B 7/003* (2013.01); *G01R 31/343* (2013.01); *G05B 19/4065* (2013.01);
(Continued)

(58) Field of Classification Search
CPC .......... G02B 2027/014; G02B 27/017; G02B 2027/0178; G06F 3/013

USPC .......................... 702/150, 155, 182–185, 151
See application file for complete search history.

(56) References Cited

U.S. PATENT DOCUMENTS

| | | | |
|---|---|---|---|
| 4,303,882 A | 12/1981 | Wolfinger | 324/158 MG |
| 4,926,105 A | 5/1990 | Mischenko et al. | 318/800 |

(Continued)

FOREIGN PATENT DOCUMENTS

| | | | | |
|---|---|---|---|---|
| EP | 0 632 283 A1 | 1/1995 | | G01R 31/34 |
| EP | 1 283 594 A1 | 2/2003 | | H02P 7/63 |

(Continued)

OTHER PUBLICATIONS

International Search Report mailed May 10, 2012 in corresponding application No. PCT/EP2012/001233.

(Continued)

*Primary Examiner* — Edward Raymond (57) ABSTRACT

A method, apparatus and computer program for monitoring the condition of electromechanical systems in which electrical rotating machinery is used. The method includes measuring current and/or voltage signals, measuring an angular position of a rotating shaft of interest of the electromechanical systems or estimating the value of discrete angular position of a rotating shaft, synchronizing the current and/or voltage signals to the scaled angular displacement of the rotating shaft, dividing the synchronous electrical signals into intervals corresponding to each completed rotation of the rotating shaft, averaging a number of intervals of synchronous electrical signals to obtain an average synchronous electrical signal, extracting characteristic data of the magnitude from the values of the average synchronous electrical signal, and comparing the extracted characteristic data with a threshold limit to alarm the user when the limit is exceeded.

7 Claims, 5 Drawing Sheets

(51) Int. Cl.
   *G01R 31/34*   (2006.01)
   *G05B 19/4065*   (2006.01)
   *G01R 31/06*   (2006.01)
   *G01R 31/28*   (2006.01)

(52) U.S. Cl.
   CPC .......... *G01R 31/06* (2013.01); *G01R 31/2829* (2013.01); *G05B 2219/50197* (2013.01); *H02P 2203/05* (2013.01); *H02P 2203/09* (2013.01); *H02P 2207/01* (2013.01)

(56) References Cited

U.S. PATENT DOCUMENTS

| | | | |
|---|---|---|---|
| 4,978,909 A | 12/1990 | Hendrix et al. | 324/77 B |
| 5,365,787 A * | 11/1994 | Hernandez | G01H 1/003 324/207.25 |
| 5,461,329 A | 10/1995 | Linehan et al. | 324/772 |
| 5,519,337 A | 5/1996 | Casada | 324/772 |
| 5,523,701 A | 6/1996 | Smith et al. | 324/772 |
| 5,832,414 A | 11/1998 | Hart et al. | 702/77 |
| 6,993,439 B2 | 1/2006 | Grosjean | 702/66 |
| 2003/0042861 A1 | 3/2003 | Schwartz et al. | 318/434 |
| 2004/0169482 A1 | 9/2004 | Maeda | 318/443 |
| 2009/0091289 A1 | 4/2009 | Nandi et al. | 318/700 |

FOREIGN PATENT DOCUMENTS

| | | | |
|---|---|---|---|
| EP | 1 681 762 A2 | 7/2006 | H02P 6/00 |
| EP | 2 197 104 A1 | 6/2010 | H02P 21/00 |

OTHER PUBLICATIONS

Written Opinion of the International Searching Authority mailed May 10, 2012 in corresponding application PCT/EP2012/001233.

* cited by examiner

METHOD AND APPARATUS FOR MONITORING THE CONDITION OF ELECTROMECHANICAL SYSTEMS

CROSS-REFERENCE TO RELATED APPLICATION

This is a §371 application of International patent application number PCT/EP2012/001233 filed Mar. 21, 2012, which claims the benefit of European patent application No. 11460026.5 filed on May 12, 2011, and which are incorporated herein by reference.

TECHNICAL FIELD

The present invention is concerned with a method, an apparatus and a computer program for monitoring the condition of electromechanical systems in which electrical rotating machinery is used and in which at least one electrical signal is measured during an operation of the electromechanical system.

BACKGROUND OF THE INVENTION

Condition monitoring techniques are regularly based on the measurement and subsequent analysis of vibration signals measured using casing mounted vibration transducers, such as accelerometers. The main problems associated with using casing mounted vibration transducers relate to their mounting as the vibrations measured are dependent on the transmission path from the source of the vibration to the transducer. In some situations, subtle details in the vibration signal may be attenuated by the transmission path leading to missed indicators of diminished machine condition. These transmission path effects also mean that casing mounted vibration transducers are typically permanently fixed to the structure, as small changes in transducer position can result in different vibration signals being recorded. When the equipment is located in a hostile environment the performance of these transducers may degrade over time. Casing mounted vibration transducers are also particularly sensitive to environmental noise. Although casing mounted vibration transducers do not typically impede the normal functioning of a piece of equipment, in many cases special arrangements are required to mount them on a piece of equipment. For example, many vibration transducers are required to be mounted on flat surfaces, close to the source of the vibration. Furthermore, these transducers are typically unidirectional, and such multiple transducers are necessary to obtain enough information to make a confident decision regarding the condition of a piece of equipment.

Electric motors and electric generators, or, more generally, electric rotating machines regularly form key parts of electromechanical systems. In recent years, the analysis of currents which may be measured from the power cables connecting the electrical rotating machines to the power source has been shown as a successful method for monitoring the condition of electromechanical systems. It has been shown that the currents that are induced in an electrical rotating machine change with operating conditions, often resulting in amplitude and phase modulations of large alternating current (AC) power supply currents. Changes in operating conditions related to defects such as broken rotor bars or rotor eccentricity may be related to the amplitude and frequency of modulations of the power supply currents. Motor current signature analysis (MCSA) involves analyzing measured current signals in the frequency domain, in order to diagnose and trend progressing defects. MCSA is attractive as it is relatively cheap to implement, and as the electric rotating machine forms part of the electromechanical system, the method may be thought of as nonintrusive. Primarily, MCSA has been used in the diagnosis of electric motor faults, though it has also been shown to react to changes in external loads, such as those caused by defects occurring in mechanical components such as bearings or gears.

Usually the frequency spectrum of a measured current signal is dominated by the AC power supply current. The electric motor and the attached mechanical system forming electromechanical system, cause modulations of the AC power supply current resulting in sidebands appearing in the frequency spectrum. Hence, the dominant AC power supply current may be thought of as a carrier wave. It is rare that the power supply is ideal; phase and amplitude modulations of the AC power supply current unrelated to the operating condition of the machine can occur. This is especially true in electric drive systems where control action and pulse-width modulation will result in the power supply current carrier wave being a non-stationary waveform. Similarly, it is often the case that the load acting on an electrical rotating machine may be transient. The non-stationary nature of the power supply current carrier wave results in the components owing to the power supply appearing to be distributed over a range of frequencies. This can increase the difficulty in assessing the operating condition of an electromechanical system.

From U.S. Pat. No. 5,461,329, by Linehan et al. there is a known method of dealing with the problem presented above by incorporating circuitry in the data acquisition system which changes the sampling rate of measured current signals in line with the changing frequency of the AC power supply current carrier wave. Thus a sampled data set containing only stationary carrier waves is achieved. By also only considering whole numbers of carrier waves, the method ensures that, once converted to the frequency domain, components owing to the discontinuities between the first and last sample are decreased. Thus the ease of identifying components in the frequency domain which may be matched to defects is increased.

From U.S. Pat. No. 6,993,439 B2 by Grosjean, there is a known method of converting a measured current waveform from the time domain to the spatial domain. The angular displacement of the rotor of an electrical rotating machine is identified using a characteristic in a measured current waveform. For example, the amplitude modulations resulting from commutator switching may be used to estimate the position of the rotor of a DC motor. The current waveform is then normalized to this angular displacement and analyzed in the frequency domain, thus allowing electrical rotating machines which do not rotate at constant angular velocity to be analyzed in the frequency domain.

The prior art described above, gives methods of decreasing the variability of the frequency spectrum of measured current signals. However, even when considering an electromechanical system operating at a constant angular velocity and supplied by an idealized power supply, resulting in a stationary power supply current carrier wave, the amplitudes of modulation sidebands caused by operating conditions of the electromechanical system are low relative to the power supply current carrier wave and its harmonics. This is particularly true in the consideration of faults occurring in the mechanical system to which the electric machine is attached. Furthermore, insufficient resolution of transducers used to measure current signals can lead to harmonic distortion. As a result it can be difficult to distinguish components owing to the operating condition of the electromechanical system from other more dominant components or from the noise signals owing from transducer noise, ghost noise from non-constant sources or from transient vibrations occurring in the environment of the electric rotating machine.

SUMMARY OF THE INVENTION

The present invention provides a method for monitoring the condition of an electromechanical system and an apparatus for implementing the method according to inventive method. The present invention provides also a computer program for monitoring the condition of electromechanical systems, which computer program is loadable in and executable on a data processing unit of a computer device and which computer program performs when being executed by the data processing unit of the computer device, the method according to claims 1-4.

The presented invention has many advantages over existing methods of condition monitoring such as those described above. By using either measured angular displacement signals obtained from existing angular displacement transducers or, where these are unavailable, based on electric motor current and voltage measurements, the system can be seen as non-invasive. Furthermore, the influence of issues related with the mounting of transducers, such as transmission path effects or the requirement of access to the elements of the electromechanical system is decreased.

The measured electric motor current and voltage signals are synchronized to the angular displacement of a shaft of the electromechanical system before being resampled at discrete angular displacement values, within the range zero to two pi, which are determined by the user. Considering one such discrete angular displacement value of the shaft of the electromechanical system, and assuming that said shaft has completed more than one complete rotation, this preceding process will result in a series of electric motor current and/or voltage values all synchronized to that one, discrete angular displacement. The number of electric motor current and/or voltage values contained within this series will relate to the number of complete rotations of the shaft of the electromechanical system. By taking the average value of the series of electric motor current and/or voltage values synchronized to the discrete angular displacement value, the influence of noise and periodic components unrelated to the shaft to which the measured current and voltage signals have been synchronized can be decreased. By performing the same averaging operation for each of the considered discrete angular displacement values of the shaft of the electromechanical system, a synchronous average of electrical signals comprised of averaged electric motor current and/or voltage values occurring at each considered angular displacement value may be created. The synchronous average of electrical signals consists of components of the measured electric motor current and voltage signals which repeat periodically with each complete rotation of the shaft of the electromechanical system. As many changes in operating condition of a rotating mechanical system result in changes to the electric motor current and voltage signals that repeat from rotation to rotation, the resulting synchronous average of electrical signals will incorporate a lot of information for evaluating the condition of a machine. The invention also allows for the accurate condition monitoring of electromechanical machines even when the shaft of said machine does not rotate at a constant angular velocity.

The presented invention is also advantageous relative to the previously described existing methods as it allows lower resolution transducers for measuring values of the electric motor current and voltage to be used. The measured electric motor current and voltage signals will be somewhat quantized due to transducer resolution. Transducer quantization level results in a digital signal with limited resolution being recorded. Consider once again the series of electric motor current and/or voltage values that have all been synchronized to one, discrete angular displacement value. As previously discussed, the number of electric motor current and/or voltage values that comprise the series will relate to the number of complete rotations of the shaft of the electromechanical system. It is assumed that the measurable electric motor current and voltage signals consist of an underlying signal, containing information pertaining the operating condition of the electromechanical system, superposed with naturally occurring noise, which may be described by a zero mean Gaussian function. As the number of complete rotations of the shaft of the electromechanical system tends to infinity, the proportion of measured motor current and/or voltage values recorded at discrete levels above the underlying signal to those recorded at discrete levels below the underlying signal will be equal to the proportion of distances between the two discrete transducer levels and the underlying value. Hence, by performing the operation described previously, the resulting averaged value will tend to the underlying value as the number of complete rotations tends to infinity. Thus, extending this result to all of the considered discrete angular displacement values of the shaft of the electromechanical system, the output synchronous average of electrical signals will tend to the underlying signal, containing information pertaining the operating condition of the electromechanical system, which repeats periodically with each complete rotation of the shaft of the electromechanical system. As a result of this increase in accuracy, and the associated decrease in the influence of noise, the presented invention is more sensitive to small changes in the operating condition of an electromechanical machine than existing current analysis inventions.

DETAILED DESCRIPTION OF THE INVENTION

Figure 1:
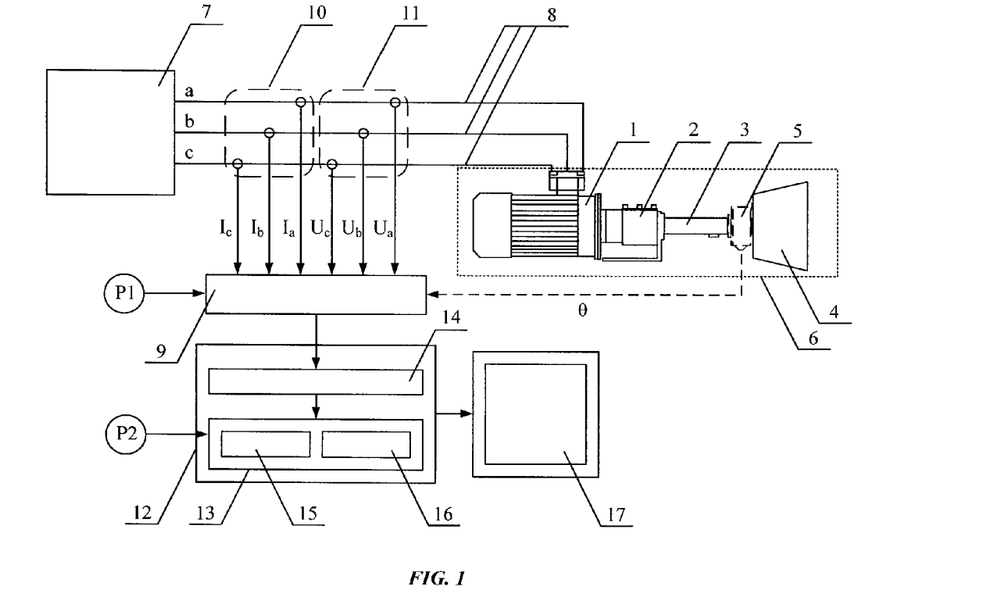
FIG. 1 is a picture of a electromechanical compressor system together with schematic view of the apparatus which may be used in the implementation of the present invention.

Referring to FIG. 1, an example application of the present invention and the apparatus of this invention for diagnosing the operating condition of an electromechanical compressor system is presented. A three phase asynchronous electric motor 1 is used to drive a two-stage reduction gearbox 2. The output of the gearbox is connected via a shaft 3 to a compressor 4. Mounted on the shaft 3 is an angular displacement transducer 5, which can be used to measure the angular displacement of the shaft. A sensor, or a group of sensors that are capable of measuring speeds or accelerations of the shaft 3, not presented in the drawing, may be used in place of the angular displacement transducer 5. In applications where it is important to track angular displacements, speeds or accelerations, such as in compressors, it is regular to instrument a system with transducers which convert angular positions into either analog or digital electronic signals. The three phase asynchronous electric motor 1, the two-stage reduction gearbox 2, the shaft 3, and the compressor 4 and, if present, an angular displacement transducer 5 together comprise the electromechanical system 6. If an angular displacement transducer 5 or sensor does indeed form part of the electromechanical system 6, then it is utilized in the application of the presented invention. However, it is also possible to apply the invention if such a transducer of sensor 5 does not form part of the electromechanical system 6. The electric power supply device 7 provides three-phase alternating current to the asynchronous electric motor 1 by way of power supply cables 8. The angular displacement transducer 5 (if present) is connected to one of the inputs to the signal conditioning unit 9. One or more outputs of current measuring devices 10, and/or voltage measuring devices 11 are connected with other inputs of the signal conditioning unit 9. The current measuring devices 10 and the voltage measuring devices 11 are connected with each of the phases a, b, c of the electric power supply device 7. The signal conditioning unit 9 is connected to a computer device 12, with a data processing unit 13 and communication module 14. In the data processing unit 13 a data storage module 15 and a synchronous averaging module 16 are implemented. Some other modules which are necessary for processing and calculating data, not presented in the drawing, are also implemented in the processor. Furthermore, the computer device 12 contains memories RAM and ROM, which are also not presented in the drawing. The computer device 12 is connected to an output unit 17 in which the results of the condition monitoring are presented to the user. The output unit 17 could be a monitor, a printer or any useful device for presentation of the results of the invention.

Figure 8:
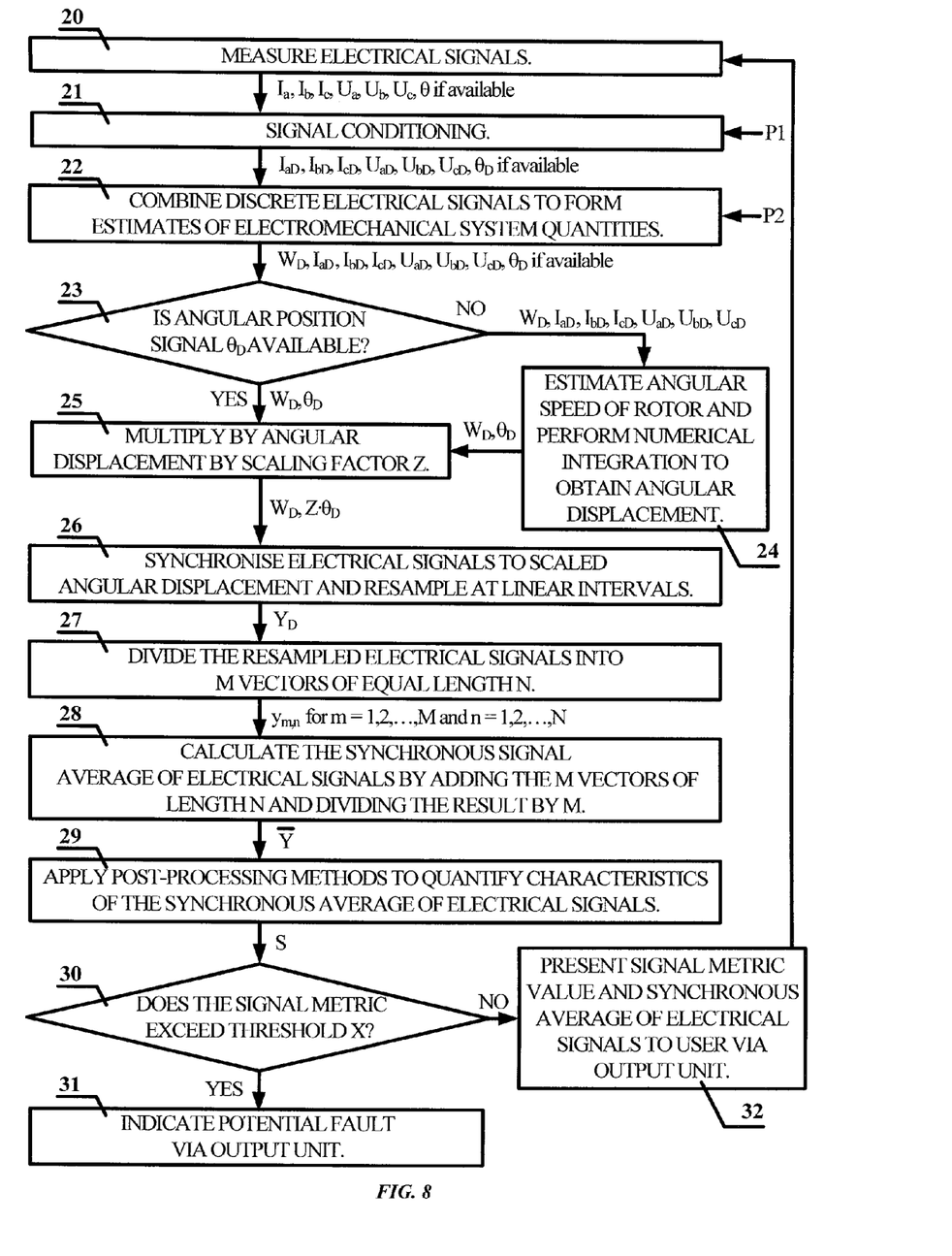
FIG. 8 presents a diagram of operations performed for condition monitoring of the electromechanical system in accordance with the present invention.

The inventive method is implemented according to the following steps 20-32 shown in FIG. 8.

Step 20

With reference to the electromechanical network shown in FIG. 1 in step 20 the analog current signals $I_a$, $I_b$, $I_c$ of the alternating current that supplies the stator winding for at least one of the phases of the three phase asynchronous electric motor 1 is measured using the current measuring devices 10, and/or at least one of the phases of the analog voltage signals $U_a$, $U_b$, $U_c$ supplying the three phase asynchronous electric motor 1 is measured using the voltage measuring devices 11. The measured analog electrical signals $I_a$, $I_b$, $I_c$, $U_a$, $U_b$, $U_c$, which take the form of analog waveforms, are subsequently supplied to the signal conditioning unit 9. If an angular displacement transducer 5 is used in the electromechanical system 6 then an angular displacement signal θ of the shaft 3 is measured and supplied to the signal conditioning unit 9.

Step 21

In the next step 21 the measured analog electrical signals $I_a$, $I_b$, $I_c$, $U_a$, $U_b$, $U_c$, are converted to discrete electrical signals $I_{aD}$, $I_{bD}$, $I_{cD}$, $U_{aD}$, $U_{bD}$, $U_{cD}$, respectively. Additionally, if an angular displacement signal θ has been measured in step 20, then it is supplied to the signal conditioning unit 9 and converted to a discrete angular displacement signal $θ_D$. The signal conditioning unit 9, which typically takes the form of an analog-to-digital converter is provided with a set of constant parameters P1, which characterize the process of converting the analog waveforms into the discrete signals, specifically the sampling rate $F_s$ and the length of the signal subjected to conversion $T_L$. The sampling rate $F_s$, which defines the number of samples taken per second, may take any value but a typical minimum rate is 1 kHz, and this is the default setting. The signal length $T_L$, defines the length of the measured analog electrical signals $I_{aD}$, $I_{bD}$, $I_{cD}$, $U_{aD}$, $U_{bD}$, $U_{cD}$, to which the analog-to-digital conversion is applied. In the embodiment of the inventive method, the minimum value of the signal length $T_L$ is 1 second. Considering the discrete current signal of the phases of the three phase asynchronous electric motor 1, $I_{aD}$ consists of the current value $i_{ak}$ of k consecutive samples, ranging from the first sample, k=1, to k=L, L being the number of samples contained in the signal. The other discrete electrical signals $I_{bD}$, $I_{cD}$, $U_{aD}$, $U_{bD}$, $U_{cD}$ may also be described in an analogous way. If an angular displacement signal θ has been supplied to the signal conditioning unit 9 it is converted into the discrete angular displacement signal $θ_D$, which consists of the angular displacement value $θ_k$ of k consecutive samples ranging from the first sample, k=1, to k=L. The conversion process is well known in the art. The discrete electrical signals $I_{aD}$, $I_{bD}$, $I_{cD}$, $U_{aD}$, $U_{bD}$, $U_{cD}$, and if available, the discrete angular displacement signal $θ_D$ are automatically transmitted to the computer device 12 via the communication module 14 and stored in the data storage module 15 of the data processing unit 13.

Step 22

In step 22 the computer device 12 is supplied with a set of constant parameters P2 which are stored in the data storage module 15 of the data processing unit 13. The set of constant parameters P2 consists of the desired number of averages to be performed $M_{input}$, the number N of sampling points for every complete rotation of the shaft 3 of the electromechanical system 6, a warning threshold value X and a constant scaling factor Z. In many cases the constant scaling factor Z describes a relationship between the angular displacements of two interconnected shafts. For example and with reference to the two-stage reduction gearbox 2 of the exemplary embodiment, by setting the constant scaling factor Z to a value equal to the gear ratio between the gear connected to shaft 3 and a meshing gear on the lay shaft of the two-stage reduction gearbox 2 (not shown in FIG. 1) it is possible to use the inventive method to diagnose the operating condition of components mounted on the lay shaft. In the data processing unit 13 of the computer device 12 the discrete electrical signals $I_{aD}$, $I_{bD}$, $I_{cD}$, $U_{aD}$, $U_{bD}$, $U_{cD}$ are combined to form estimates of electromechanical system quantities such as current space phasors, voltage space phasors, the developed electromagnetic torque of the three phase asynchronous electric motor 1 or the developed electromagnetic flux of the three phase asynchronous electric motor 1. In the exemplary embodiment of the invention only the discrete current signals $I_{aD}$, $I_{bD}$, $I_{cD}$, are combined to form a discrete complex stator current space phasor signal $\Psi_D$ according to the formula:

$$\Psi_D = \frac{2}{3}\left[I_{aD} + e^{j2\pi/3} I_{bD} + (e^{j2\pi/3})^2 I_{cD}\right] \quad (1)$$

The absolute value of the discrete complex stator current space phasor signal $\Psi_D$ forms a discrete stator current amplitude signal $W_D$, given as:

$$W_D = |\Psi_D| \quad (2)$$

Figure 2:
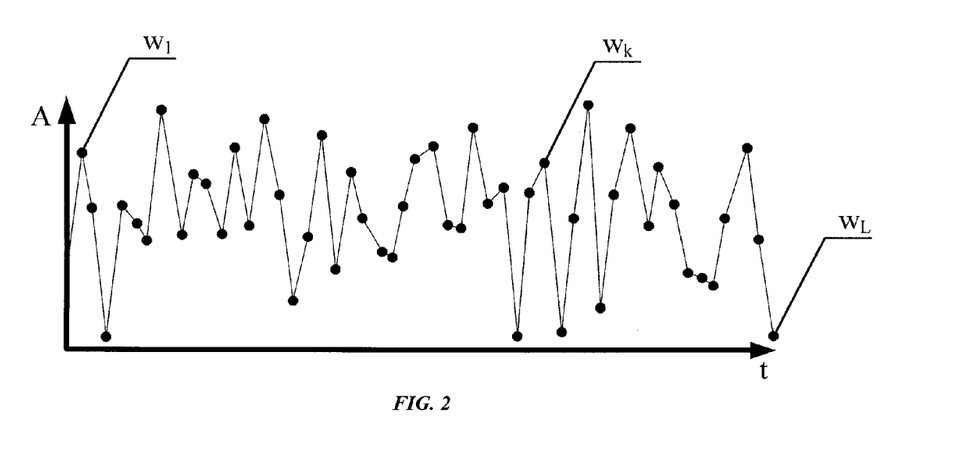
FIG. 2 is a plot of the discrete stator current amplitude signal $W_D$, in the time domain ($W_D$ has units of amperes [A])

FIG. 2 is a plot of the discrete stator current amplitude signal $W_D$, in the time domain. As a consequence of being formed of the discrete electrical signals $I_{aD}$, $I_{bD}$, $I_{cD}$, $U_{aD}$, $U_{bD}$, $U_{cD}$, the discrete current amplitude signal $W_D$ consists of the stator current amplitude value $w_k$ of k consecutive samples ranging from the first sample, k=1, to k=L, L being the sample length. In the described embodiment $W_D$ has units of amperes, [A]. Those skilled in the state of the art will recognize that there are various electromechanical system quantities which may be estimated using discrete electrical signals $I_{aD}$, $I_{bD}$, $I_{cD}$, $U_{aD}$, $U_{bD}$, $U_{cD}$ and that it is to be understood that the discrete stator current amplitude signal $W_D$, which is used in subsequent steps could be replaced by other estimates of electromechanical system quantities without departing from the scope of the invention as defined in the claims. If parameters of the three phase asynchronous electric motor 1 are required in the estimation of certain electromechanical system quantities then these are included in the set of constant parameters P2 which are supplied to the computer device 12 and stored in the data storage module 15 of the data processing unit 13. Returning to the exemplary embodiment, in addition to the discrete electrical signals $I_{aD}$, $I_{bD}$, $I_{cD}$, $U_{aD}$, $U_{bD}$, $U_{cD}$ and, if available, the discrete angular displacement signal $\theta_D$, the discrete current amplitude signal $W_D$ calculated in step 22 is used in subsequent steps.

Step 23

In step 23 the presence of a discrete angular displacement signal $\theta_D$ within the data transmitted to the data storage module 15 of the data processing unit 13 is checked. If all necessary data i.e. the discrete current amplitude signal $W_D$ and the discrete angular displacement signal $\theta_D$ are present, then step 25 is carried out. If the discrete angular displacement signal $\theta_D$ is absent among the data transmitted to the data processing unit 13, then a process of calculating an estimation of the angular displacement $\theta_{DEst}$ of the rotor of the three phase asynchronous electric motor 1 is carried out in step 24.

Step 24

In step 24 in the data processing unit 13 an estimation of the angular displacement $\theta_{DEst}$ of the rotor of three phase asynchronous electric motor 1 is calculated on the basis of the discrete electrical signals $I_{aD}$, $I_{bD}$, $I_{cD}$, $U_{aD}$, $U_{bD}$, $U_{cD}$. Those who are skilled in the state of the art will recognize that there are many ways of estimating the angular velocity of the rotor of an electrical rotating machine from measured electrical signals. Various methods of estimating the first time derivative of the electrical rotor angle of an electrical machine are described by Peter Vas in "Sensorless vector and direct torque control" (Oxford University Press, UK, 1998, ISBN 978-0-19-856465-2). An estimate of the mechanical angular displacement of the rotor of the electrical rotating machine is obtained by numerically integrating the first time derivative of the electrical rotor angle of the electrical machine using known methods, and then multiplying the resulting signal by the number of pole pairs of the three phase asynchronous electric motor 1. If necessary, the estimate of the mechanical angular displacement of the rotor of the electrical rotating machine is resampled using known methods, so that the resulting estimation of the angular displacement $\theta_{DEst}$ is synchronized to the discrete current amplitude signal $W_D$. $\theta_{DEst}$ consists of the estimated angular displacement value $\theta_{kEst}$ of k consecutive samples ranging from the first sample, k=1, to k=L. If step 24 is enacted then the estimation of the angular displacement $\theta_{DEst}$ is used in subsequent steps. As such estimated data is very similar to an equivalently measured data, it is convenient to assume that $\theta_D = \theta_{DEst}$ and for simplification only the symbol of $\theta_D$ is used in describing the subsequent steps. A result of using this functionality is that the methodology retains its attribute of being non-invasive.

Step 25

Figure 3:
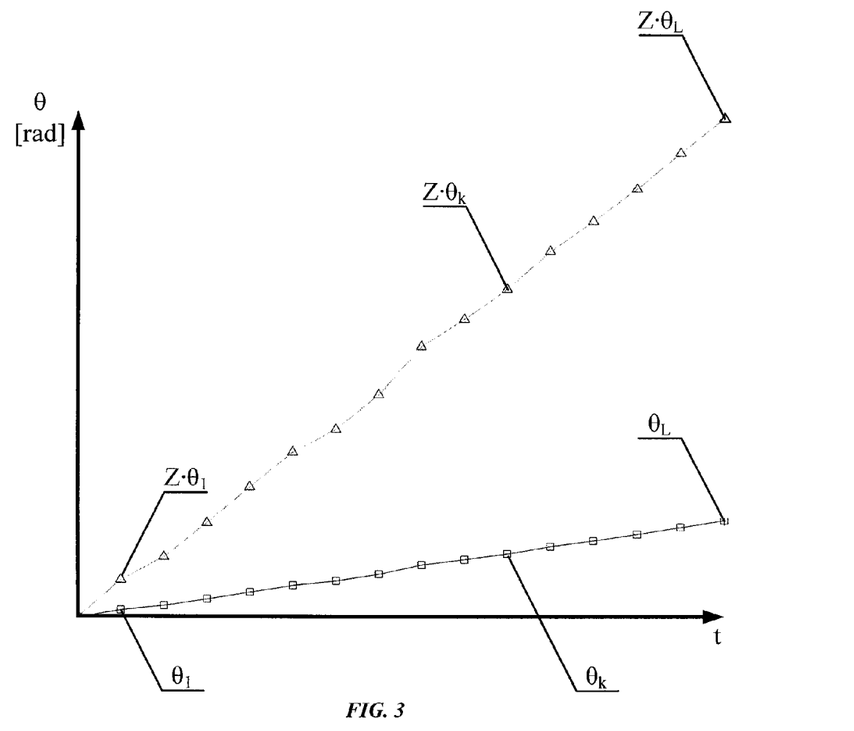
FIG. 3 is a plot of a discrete angular displacement signal $\theta_D$ and a scaled discrete angular displacement signal $Z \cdot \theta_D$, in radians, versus time.

At step 25 in the synchronous averaging module 16 the constant scaling factor Z is taken from the constant parameter set P2 which is stored in the data storage module 15. The discrete angular displacement signal $\theta_D$ is multiplied by the constant scaling factor Z. The result of multiplying the discrete angular displacement signal $\theta_D$ by the constant scaling factor Z is a scaled discrete angular displacement signal $Z \cdot \theta_D$. $Z \cdot \theta_D$ consists of the estimated angular displacement value $Z \cdot \theta_k$, of k consecutive samples ranging from the first sample, k=1, to k=L. In FIG. 3 the original discrete angular displacement signal $\theta_D$ is shown in a time domain as a solid line, whilst the dashed line shows the scaled discrete angular displacement signal $Z \cdot \theta_D$, where the constant scaling factor Z has a value which represents the output to input ratio of the gearbox 2.

Step 26

Figure 4:
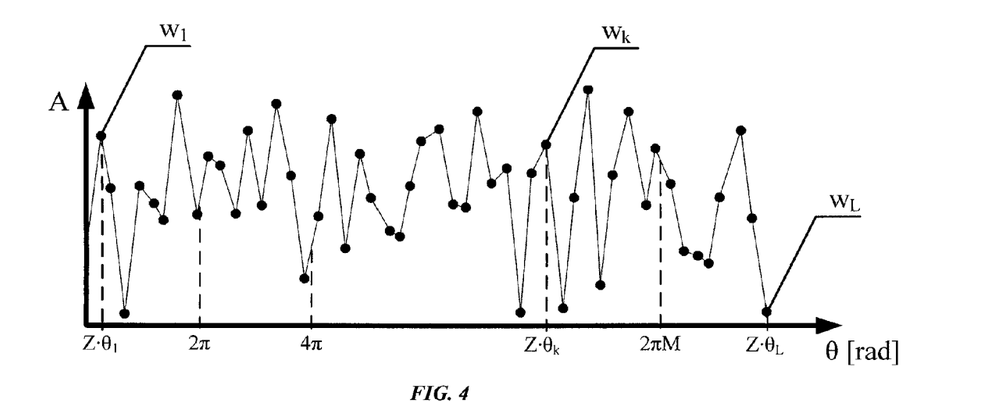
FIG. 4 is a plot of the discrete stator current amplitude signal $W_D$, versus angular displacement, in radians, what is achieved by synchronizing the discrete stator current amplitude signal $W_D$ to the scaled discrete angular displacement signal $Z \cdot \theta_D$.
Figure 5:
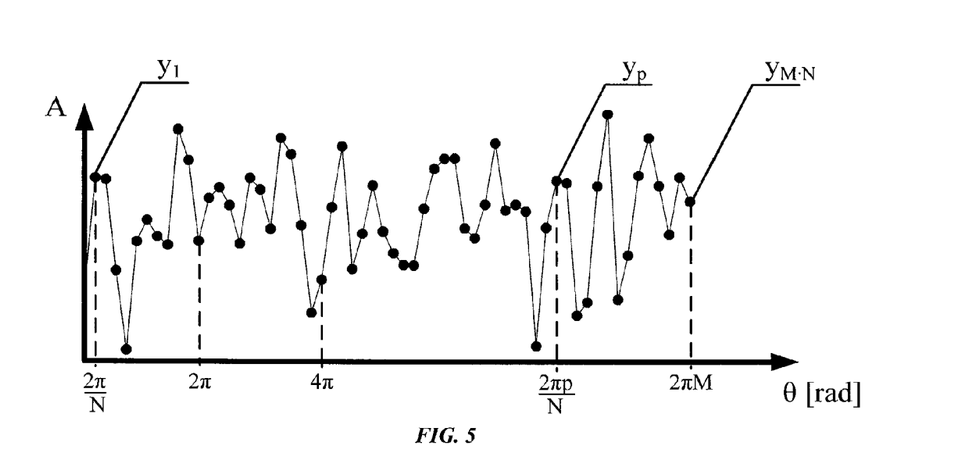
FIG. 5 is a plot of a resampled discrete current amplitude signal $Y_D$ versus angular displacement, in radians.

As both the scaled discrete angular displacement signal $Z \cdot \theta_D$ and the discrete stator current amplitude signal $W_D$ are comprised of values sampled at the same points in time, it is possible to synchronize the discrete current amplitude signal $W_D$ to the scaled discrete angular displacement signal $Z \cdot \theta_D$. Hence it is possible to show the discrete current amplitude signal $W_D$ versus angular displacement, $\theta$, in radians as is shown in FIG. 4. In step 26 in the synchronous averaging module 16 the discrete current amplitude signal $W_D$, which has been synchronized to the scaled discrete angular displacement signal $Z \cdot \theta_D$ is resampled at angular positions given in the resampling vector $\theta_R$. The resampling vector $\theta_R$ consists of the angular displacement values $\theta_{R,p}$ given as $$\theta_{R,p} = \frac{2\pi p}{N}, \text{ for } p = 1, 2, \ldots M \cdot N \quad (3)$$

where M is the number of averages to be performed is obtained from the calculation:

$$M = \begin{cases} M_{input}, & \text{if } M_{input} < \left\lfloor \frac{Z \cdot \theta_L}{2\pi} \right\rfloor \\ \left\lfloor \frac{Z \cdot \theta_L}{2\pi} \right\rfloor, & \text{if } M_{input} \geq \left\lfloor \frac{Z \cdot \theta_L}{2\pi} \right\rfloor \end{cases} \quad (4)$$

where the number of averages to be performed M and the number N of sampling points for every complete rotation of the shaft 3 of the electromechanical system 6 are taken from the constant parameter set P2 which is stored in the data storage module 15. Note that this process requires the desired number of averages to be performed $M_{input}$ by the user at step 22 to be less than the total number of completed rotations of the scaled discrete angular displacement signal $Z \cdot \theta_D$. If the user has inserted a number greater than the total number of completed rotations of the scaled discrete angular displacement signal $Z \cdot \theta_D$ then the number of averages to be performed M is limited to the total number of completed rotations of the scaled discrete angular displacement signal $Z \cdot \theta_D$ in accordance with calculation (4). The resampling of the discrete current amplitude signal $W_D$ at the angular positions given in the resampling vector $\theta_R$ is conducted using known techniques. The resulting resampled discrete current amplitude signal $Y_D$ consists of resampled stator current amplitude values $y_p$ at p consecutive samples ranging from the first sample, p=1, to p=M·N, M being the number of averages to be performed and N being the number of sampling points for every complete rotation. The resampled discrete current amplitude signal $Y_D$ is used in subsequent steps. At FIG. 5 the resampled discrete current amplitude signal $Y_D$ is the result of resampling the discrete stator current amplitude signal $W_D$ at linear intervals of the scaled discrete angular displacement signal $Z \cdot \theta_D$;

Step 27

Figure 6:
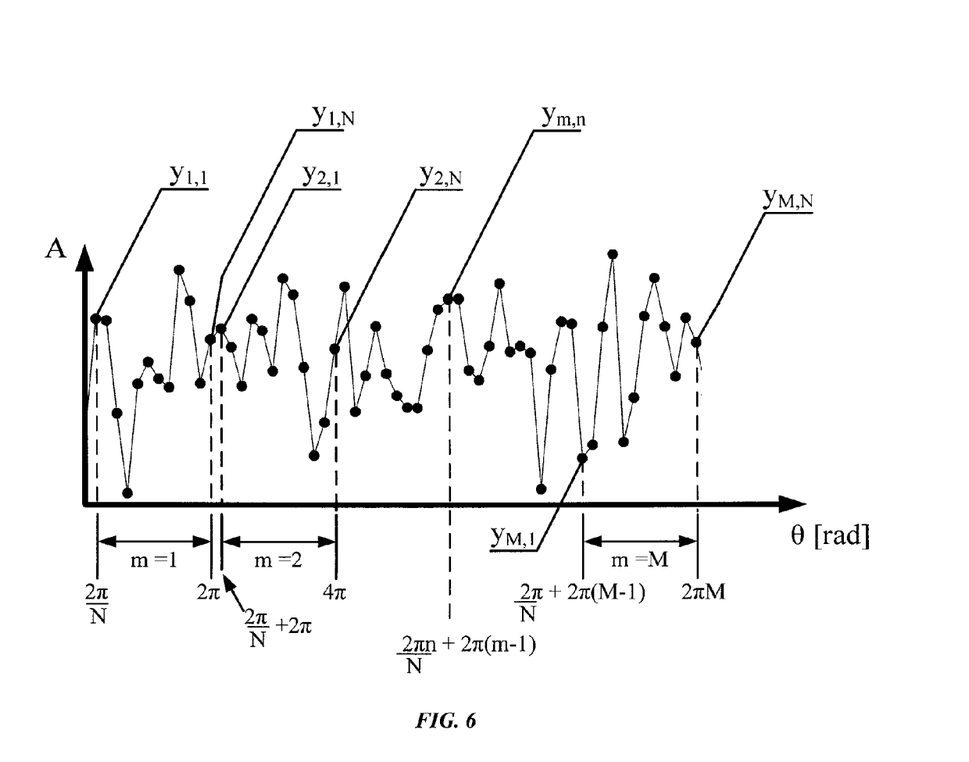
FIG. 6 is a plot of the resampled discrete current amplitude signal $Y_D$ versus angular displacement, in radians with additional annotations detailing the process of dividing the resampled discrete current amplitude signal $Y_D$ into M intervals of equal length N.

In step 27, in the synchronous averaging module 16, the resampled discrete current amplitude signal $Y_D$ is divided into M consecutive intervals, each containing N consecutive samples, thus allowing the resampled stator current amplitude values $y_p$ to be written as $y_{m,n}$, where n are the consecutive samples ranging from, n=1, to n=N and m are the consecutive intervals ranging from, m=1, to m=M. FIG. 6 is a plot of the resampled discrete current amplitude signal $Y_D$ versus angular displacement, in radians with additional annotations detailing the process of dividing the resampled discrete current amplitude signal $Y_D$ into M intervals of equal length N.

Step 28

At step 28 in the synchronous averaging module 16, the synchronous average of the electrical signals $\overline{Y}$ is calculated. The synchronous average of the electrical signals $\overline{Y}$, consists of n averaged values of the electrical signals $\overline{y}_n$ calculated using:

$$\overline{y}_n = \frac{1}{M} \sum_{m=1}^{M} y_{m,n}, \text{ for } n = 1, 2, \ldots, N. \tag{5}$$

Hence the synchronous average of the electrical signals $\overline{Y}$ may be calculated as:

$$\overline{Y} = [\overline{y}_1, \overline{y}_2, \ldots \overline{y}_N]. \tag{6}$$

Figure 7:
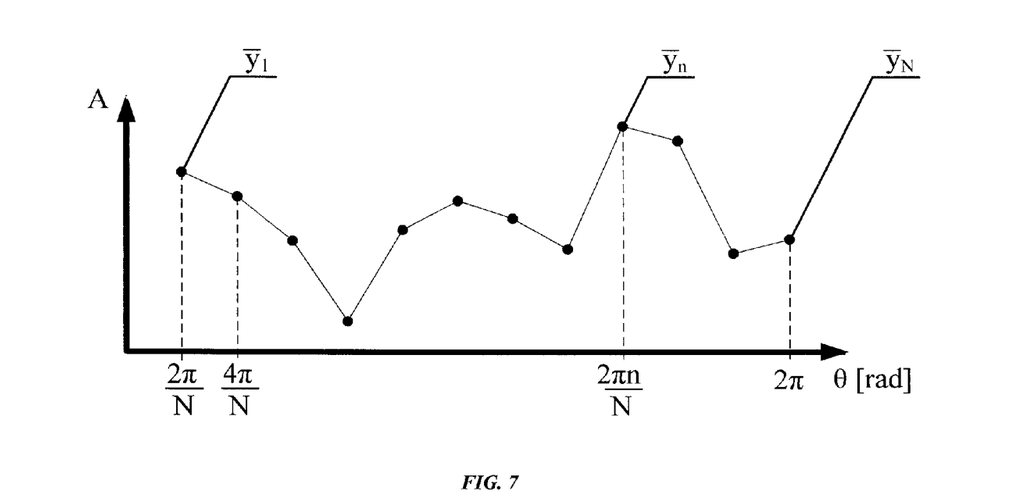
FIG. 7 is a plot of the synchronous average of the electrical signals $\overline{Y}$ versus angular displacement, in radians.

The synchronous average of the electrical signals $\overline{Y}$ is sampled at linear angular displacement intervals in the range zero to two π according to the calculation:

$$\theta_n = \frac{2\pi n}{N}, \text{ for } n = 1, 2, \ldots, N, \tag{7}$$

where $\theta_n$ is the discrete angular displacement value at sampling point n. FIG. 7 is a plot of the synchronous average of the electrical signals $\overline{Y}$ versus angular displacement, in radians.

Step 29

In step 29 in the synchronous averaging module 16, a kurtosis S of the synchronous average of the electrical signals $\overline{Y}$ is calculated according to formula:

$$S = \frac{1}{N} \sum_{n=1}^{N} \left( \overline{y}_n - \sum_{n=1}^{N} \overline{y}_n \right)^2 \tag{8}$$

The value of the kurtosis S of the synchronous average of the electrical signals $\overline{Y}$, gives a measure of the magnitude of large localized deviations in the synchronous average of the electrical signals $\overline{Y}$, which can be caused by localized defects such as tooth cracking or pitting in gear teeth. Those skilled in the art will appreciate that there are many different signal processing methodologies available for extracting information from the synchronous average of the electrical signals $\overline{Y}$, ranging from time domain metrics, spectral analyses or time-frequency analyses which may be substituted for the kurtosis operation given within this step without significantly changing the scope of this invention.

Step 30

In step 30 in the synchronous averaging module 16, the threshold value X is taken from the constant parameter set P2 which is stored in the data storage module 15. A typical value for the threshold value X=3.5. If the value of the kurtosis S of the synchronous average of the electrical signals is below the threshold value X, then the kurtosis S of the synchronous average of the electrical signals, as well as the synchronous average of the electrical signals $\overline{Y}$ is indicated to the user via the output unit 17 in step 32. If the value of the kurtosis S of the synchronous average of the electrical signals is above the threshold value X, then in addition to the kurtosis S of the synchronous average of the electrical signals and the synchronous average of the electrical signals $\overline{Y}$, a warning is also indicated to the user via the output unit 17 in step 31.

Step 31.

At step 31 the synchronous average of the electrical signals $\overline{Y}$, the kurtosis S and the warning obtained in step 30 are automatically supplied to the user, via the output unit 18 using known methods.

Step 32

At step 32 the synchronous average of the electrical signals $\overline{Y}$ and the kurtosis S are automatically supplied to the user, via the output unit 18 using known methods. Additionally, the inventive method is restarted at step 20.

| Letter | Name |
|---|---|
| NOMENCLATURE | |
| a, b, c | phases of the electric power supply device |
| $I_a, I_b, I_c$ | analog current signals |
| $U_a, U_b, U_c$ | analog voltage signals |
| Θ | angular displacement signal |
| $I_{aD}, I_{bD}, I_{cD}, U_{aD}, U_{bD}, U_{cD}$ | discrete electrical signals |
| $\theta_D$ | discrete angular displacement signal |
| $P_1$ | constant parameters which characterize the process of converting the analog waveforms into the discrete signals |
| $F_s$ | sampling rate |
| $T_L$ | the length of the signal subjected to conversion |
| $i_{a,k}$ | current value at sampling point k |
| L | the number of samples contained in the signal |
| $\theta_k$ | angular displacement value at sampling point k |

-continued

NOMENCLATURE

| Letter | Name |
|---|---|
| $P_2$ | a set of constant parameters supplied to the computer device 12 |
| $M_{input}$ | the desired number of averages to be performed |
| N | the number of sampling points for every complete rotation of the shaft 3 of the electromechanical system |
| X | the warning threshold value |
| Z | constant scaling factor |
| $\Psi_D$ | discrete complex stator current space phasor signal |
| $W_D$ | the discrete stator current amplitude signal |
| $w_k$ | the stator current amplitude value at sampling point k |
| A | Amperes (units of $W_D$) |
| $\theta_{DEst}$ | estimation of the angular displacement of the rotor of the three phase asynchronous electric motor 1 |
| $\theta_{kEst}$ | the estimated angular displacement value at sampling point k |
| $Z \cdot \theta_D$ | scaled discrete angular displacement signal. |
| $Z \cdot \theta_k$ | estimated angular displacement value at sampling point k |
| $\theta_R$ | resampling vector |
| $\theta_{R,p}$ | the angular displacement values (which comprise the Resampling vector $\theta_R$) at sampling point p |
| M | the number of averages to be performed |
| $Y_D$ | resampled discrete current amplitude signal |
| $y_p$ | resampled stator current amplitude values at sampling point p |
| $y_{m,n}$ | resampled stator current amplitude values at sampling point n in interval m |
| $\overline{Y}$ | the synchronous average of the electrical signals |
| $\overline{y}_n$ | averaged values of the electrical signals at sampling point n |
| S | kurtosis of the synchronous average of the electrical signals $\overline{Y}$ |

What is claimed is:

1. A method for monitoring the condition of an electromechanical system comprising the steps of:
   measuring current and/or voltage signals of an electromechanical system,
   measuring an angular position of a rotating shaft of interest of the electromechanical systems or estimating the value of discrete angular position of a rotating shaft of interest of the electromechanical system,
   synchronizing the current and/or voltage signals to the scaled angular displacement of the rotating shaft,
   dividing the synchronous electrical signals into intervals corresponding to each completed rotation of the rotating shaft,
   averaging a number of intervals of synchronous electrical signals to obtain an average synchronous electrical signal, wherein the averaging of M intervals of synchronous electrical signals corresponding to M complete rotations of the rotation shaft is obtained from the average of the synchronous electrical signals ($\overline{Y}$), consisting of M averaged values of the electrical signals $\overline{y}_n$ which is calculated from the formula $$\overline{y}_n = \frac{1}{M} \sum_{m=1}^{M} y_{m,n}, \text{ for } n = 1, 2, \ldots, N,$$

where $y_{m,n}$ is the synchronous electrical signal values at sampling point n in interval m, where N is a number of sampling points for every complete rotation of the rotating shaft of the electromechanical system, and where M is a number of averages to be performed,
   extracting characteristic data of the magnitude from the values of the average synchronous electrical signal,
   comparing the extracted characteristic data of the magnitude with a threshold which is given as a limit, and
   indicating an alarm to the user when the limit is exceeded.

2. A method according to claim 1, wherein a kurtosis S of the average synchronous electrical signals represents the characteristic data of the magnitude from the values of the average synchronous electrical signal and is calculated according to the formula:

$$S = \frac{1}{N} \sum_{n=1}^{N} \left( \overline{y}_n - \sum_{n=1}^{N} \overline{y}_n \right)^2.$$

3. An apparatus for monitoring the condition of electromechanical systems comprising:
   means for measuring current and/or voltage signals of an electromechanical system,
   means for measuring an angular position of a rotating shaft of interest of the electromechanical systems or means for estimating the value of discrete angular position of a rotating shaft of interest of the electromechanical system,
   means for synchronizing current and/or voltage signals to a scaled angular displacement of the rotating shaft,
   means for dividing the synchronous electrical signals into intervals corresponding to each completed rotation of the rotating shaft,
   means for averaging a number of intervals of synchronous electrical signals, wherein the averaging of M intervals of synchronous electrical signals corresponding to M complete rotations of the rotation shaft is obtained from the average of the synchronous electrical signals ($\overline{Y}$), consisting of M averaged values of the electrical signals $\overline{y}_n$ which is calculated from the formula $$\overline{y}_n = \frac{1}{M} \sum_{m=1}^{M} y_{m,n}, \text{ for } n = 1, 2, \ldots, N,$$

where $y_{m,n}$ is the synchronous electrical signal values at sampling point n in interval m, where N is a number of sampling points for every complete rotation of the rotating shaft of the electromechanical system, and where M is a number of averages to be performed,
   means for extracting from the values of the average synchronous electrical signals, a characteristic data of the magnitude, and comparing the extracted characteristic data of the magnitude with a threshold which is given as a limit,
   means for comparing the extracted characteristic data of the magnitude with a threshold which is given as a limit, and
   means for indicating an alarm to the user when the limit is exceeded.

4. An apparatus according to claim 3 wherein means for synchronizing current and/or voltage signals to a scaled angular displacement of the rotating shaft, means for dividing the synchronous electrical signals into intervals corresponding to each completed rotation of the rotating shaft, means for averaging a number of intervals of synchronous electrical signals, means for extracting from the values of the average synchronous electrical signals, a characteristic data of the magnitude, and comparing the extracted characteristic data of the magnitude with a threshold which is given as a limit are implemented in a synchronous averaging module of a computer device.

5. The apparatus according to claim 4, wherein a kurtosis S of the average synchronous electrical signals represents the characteristic data of the magnitude from the values of the average synchronous electrical signal and is calculated according to the formula:

$$S = \frac{1}{N} \sum_{n=1}^{N} \left( \overline{y}_n - \sum_{n=1}^{N} \overline{y}_n \right)^2.$$

6. A computer program for monitoring the condition of electromechanical systems, which computer program is loadable in and executable on a data processing unit of a computer device and which computer program performs when being executed by the data processing unit of the computer device, wherein the computer program performs a method comprising
measuring current and/or voltage signals of an electromechanical system,
measuring an angular position of a rotating shaft of interest of the electromechanical systems or estimating the value of discrete angular position of a rotating shaft of interest of the electromechanical system,
synchronizing the current and/or voltage signals to the scaled angular displacement of the rotating shaft,
dividing the synchronous electrical signals into intervals corresponding to each completed rotation of the rotating shaft,
averaging a number of intervals of synchronous electrical signals to obtain an average synchronous electrical signal, wherein the averaging of M intervals of synchronous electrical signals corresponding to M complete rotations of the rotation shaft is obtained from the average of the synchronous electrical signals ($\overline{Y}$), consisting of M averaged values of the electrical signals $\overline{y}_n$ which is calculated from the formula $$\overline{y}_n = \frac{1}{M} \sum_{m=1}^{M} y_{m,n}, \text{ for } n = 1, 2, \ldots, N,$$

where $y_{m,n}$ is the synchronous electrical signal values at sampling point n in interval m where N is a number of sampling points for every complete rotation of the rotating shaft of the electromechanical system, and where M is a number of averages to be performed,
extracting characteristic data of the magnitude from the values of the average synchronous electrical signal,
comparing the extracted characteristic data of the magnitude with a threshold which is given as a limit, and
indicating an alarm to the user when the limit is exceeded.

7. The computer program according to claim 6, wherein a kurtosis S of the average synchronous electrical signals represents the characteristic data of the magnitude from the values of the average synchronous electrical signal and is calculated according to the formula:

$$S = \frac{1}{N} \sum_{n=1}^{N} \left( \overline{y}_n - \sum_{n=1}^{N} \overline{y}_n \right)^2.$$

* * * * *